United States Patent [19]
Rodes et al.

[11] Patent Number: 4,774,477

[45] Date of Patent: Sep. 27, 1988

[54] POWER AMPLIFIER HAVING LOW INTERMODULATION DISTORTION

[75] Inventors: William D. Rodes, Marion; David L. Krett, Cedar Rapids, both of Iowa

[73] Assignee: Rockwell International Corporation, El Segundo, Calif.

[21] Appl. No.: 28,422

[22] Filed: Mar. 18, 1987

[51] Int. Cl.$^4$ .............................................. H03F 3/16
[52] U.S. Cl. .................................... 330/277; 330/195
[58] Field of Search .............. 330/264, 268, 269, 277, 330/165, 195, 196, 197; 455/126, 127

[56] References Cited

U.S. PATENT DOCUMENTS

| | | | |
|---|---|---|---|
| 1,912,891 | 6/1933 | Drake | 330/195 X |
| 1,970,325 | 8/1934 | Kreer, Jr. | 330/196 X |
| 2,043,587 | 6/1936 | Macalpine | 330/195 X |
| 2,895,019 | 7/1959 | Farber | 330/197 |
| 3,210,671 | 10/1965 | Lofting | 330/195 X |
| 3,256,491 | 6/1966 | Dewey et al. | 330/286 |
| 3,348,155 | 10/1967 | Von Recklinghausen | 330/277 X |
| 3,595,998 | 7/1971 | Fidi et al. | 330/277 X |
| 3,716,730 | 2/1973 | Cerny, Jr. | 330/277 X |
| 4,453,131 | 6/1984 | Paullus | 330/97 |

Primary Examiner—Eugene R. Laroche
Assistant Examiner—Steven J. Mottola
Attorney, Agent, or Firm—M. Lee Murrah; V. Lawrence Sewell; H. Fredrick Hamann

[57] ABSTRACT

Intermodulation distortion in RF FET amplifiers operating in the Class AB mode is reduced without limiting the bandwidth by providing transformer coupled outputs from both the source and drain circuits. The negative feedback provided by the transformer in the source circuit reduces distortion but does not limit bandwidth in the manner of the reactive network normally used for correct phasing in circuits employing drain to gate feedback. Using this technique, the distortion components are typically 40-45 dB below the desired signal when a two-tone test is used, which exceeds the typically available level of 30 dB in prior art circuits.

8 Claims, 3 Drawing Sheets

POWER AMPLIFIER HAVING LOW INTERMODULATION DISTORTION

BACKGROUND OF THE INVENTION

The invention relates to radio frequency power amplifiers, and more particularly to such power amplifiers utilizing field-effect-transistors (FET's).

An important goal in the design of radio frequency (RF) power amplifiers used for high performance data transmission is low intermodulation distortion (IMD), which is caused by non-linearities in the amplifying device. In a FET amplifier operated in the Class AB mode, the distortion is increased by operation of the device in the cutoff region.

In the prior art intermodulation distortion was reduced by providing negative feedback between the FET source and gate. However, in order to obtain the proper phase relationship in the feedback signal, a network of reactive components was conventionally used. Using this technique the distortion components are typically 30 db below the desired signal when a two-tone test is used, which exceed the typically desired level of 35 db. However, the use of such components restricts the gain of the amplifier to a relatively narrow bandwidth, making the amplifier inappropriate for the broadband designs which are widely used in modern equipment. Levels below 45 db can be achieved without the use of reactive feedback components using the feedforward technique, but this technique is complex and expensive.

It is therefore an object of the present invention to provide an RF amplifier having reduced intermodulation distortion.

It is another object of the present invention to provide an RF amplifier which is broadbanded.

It is a further object of the present invention to provide an RF amplifier with the foregoing characteristics which non-complex and less expensive prior art techniques.

SUMMARY OF THE INVENTION

With these and other objects in view, low intermodulation distortion and wideband performance are provided in an RF amplifier employing a field-effect-transistor by providing output circuit means in both the source and drain circuits and combining the signals provided by both means to produce a single output signal. Placing the output circuit means in the FET source circuit provides the necessary negative feedback via the current mode to reduce the distortion caused particularly by Class AB operation, without the bandwidth limiting reactive components used in standard drain to gate feedback arrangements.

BRIEF DESCRIPTION OF THE DRAWINGS

The invention may be more fully understood by reading the following description of embodiments thereof in conjunction with the appended drawings wherein.

DETAILED DESCRIPTION OF THE INVENTION

Figure 1:
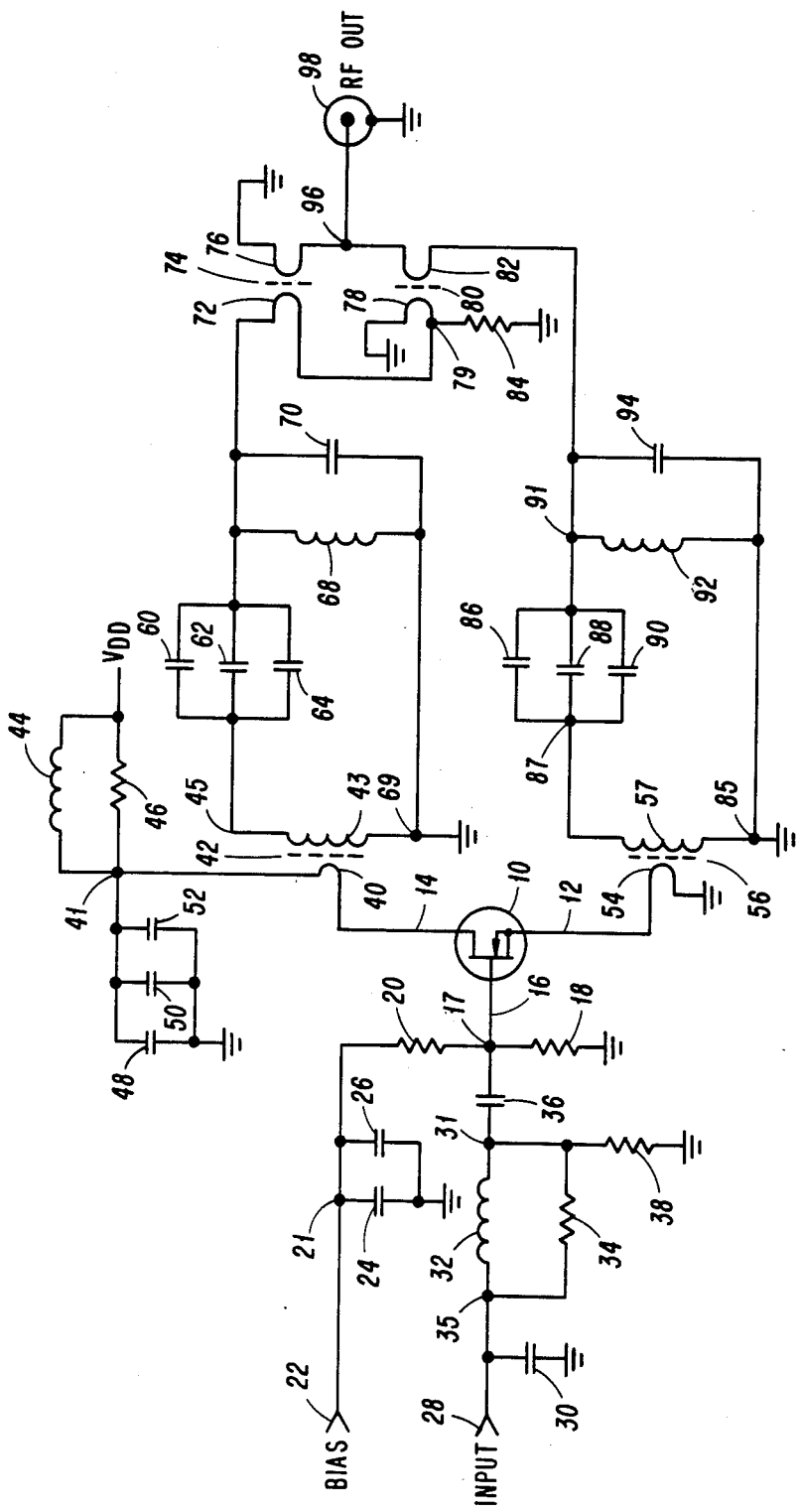
FIG. 1 is a circuit diagram of an FET power amplifier in accordance with the present invention.

The invention may be embodied in a circuit as shown in FIG. 1, employing a single field-effect-transistor (FET) 10 having a source 12, a drain 14, and a gate 16. Gate 16 is coupled at node 17 to bias resistors 18 and 20. The second lead of resistor 18 is grounded, while that of resistor 20 is coupled at node 21 to a DC bias supply 22. Also coupled to resistor 20 and bias supply 22 at node 21 is a pair of decoupling capacitors 24 and 26, which are connected in parallel and grounded on their second leads.

Gate 16 is also connected at node 17 to an RF coupling capacitor 36, which is connected on its second end at node 31 to an inductor 32 and a resistor 34, and a resistor 38. Resistor 38 is grounded on its second end and serves as a load for the output signal from the preceding stage. The second ends of inductor 32 and resistor 34 are connected at node 35 and are connected to an input signal source 28 and a capacitor 30, the second end of the latter of which is grounded. Inductor 32, resistor 34 and capacitor 30 in combination serve as a broadband matching network.

Drain 14 of FET 10 is coupled to the primary winding 40 of a transformer 42. The second lead of primary 40 is coupled at node 42 to decoupling capacitor 48, 50, and 52 which are coupled in parallel to ground, or reference potential on their second sides. Primary winding 40 is also coupled at node 41 to an inductor 44 and a resistor 46, both of whose second leads are coupled to drain supply Vdd. Source 12 of FET 10 is coupled to the primary winding 54 of a transformer 56, and the second side of primary winding 54 is grounded.

The secondary winding 43 of transformer 42 is grounded on one side at node 69. The other lead of secondary winding 54 is coupled to capacitors 60, 62, and 64, the second leads of which are coupled at node 66 to a choke 68, a capacitor 70, and the primary winding 72 of a transformer 74. The second lead of inductor 68, capacitor 70, and secondary winding 43 are intercoupled at node 69. The combination of capacitors 60, 62 and 64; inductor 68 and capacitor 70 comprise a broadband matching network.

The second lead of primary winding 72 is coupled to the primary winding 78 of transformer 80 at node 79. The second lead of primary winding 78 is grounded, and the first lead is also coupled to a balancing resistor 84, the second lead of which is grounded. Transformers 74 and 80 are preferably transmission line transformers made from coaxial cable.

The secondary winding 57 of transformer 56 is grounded on one side at node 85. The second lead of secondary winding 57 is coupled at node 87 to capacitors 86, 88, and 90, the second leads of which are coupled at node 91 to a choke 92, a capacitor 94 and the first lead of the secondary winding of transformer 80. The second lead of choke 92, capacitor 94, and the first lead of secondary winding 57 are interconnected and grounded at node 85. The combination of capacitors 86, 88, and 90, choke 92, and capacitor 94, comprise a broadband matching network.

The second lead of secondary winding 82 is coupled at node 96 to an RF output connector 98 and to the first lead of secondary winding 76 of transformer 74. The second lead of secondary winding 76 is grounded.

Figure 3:
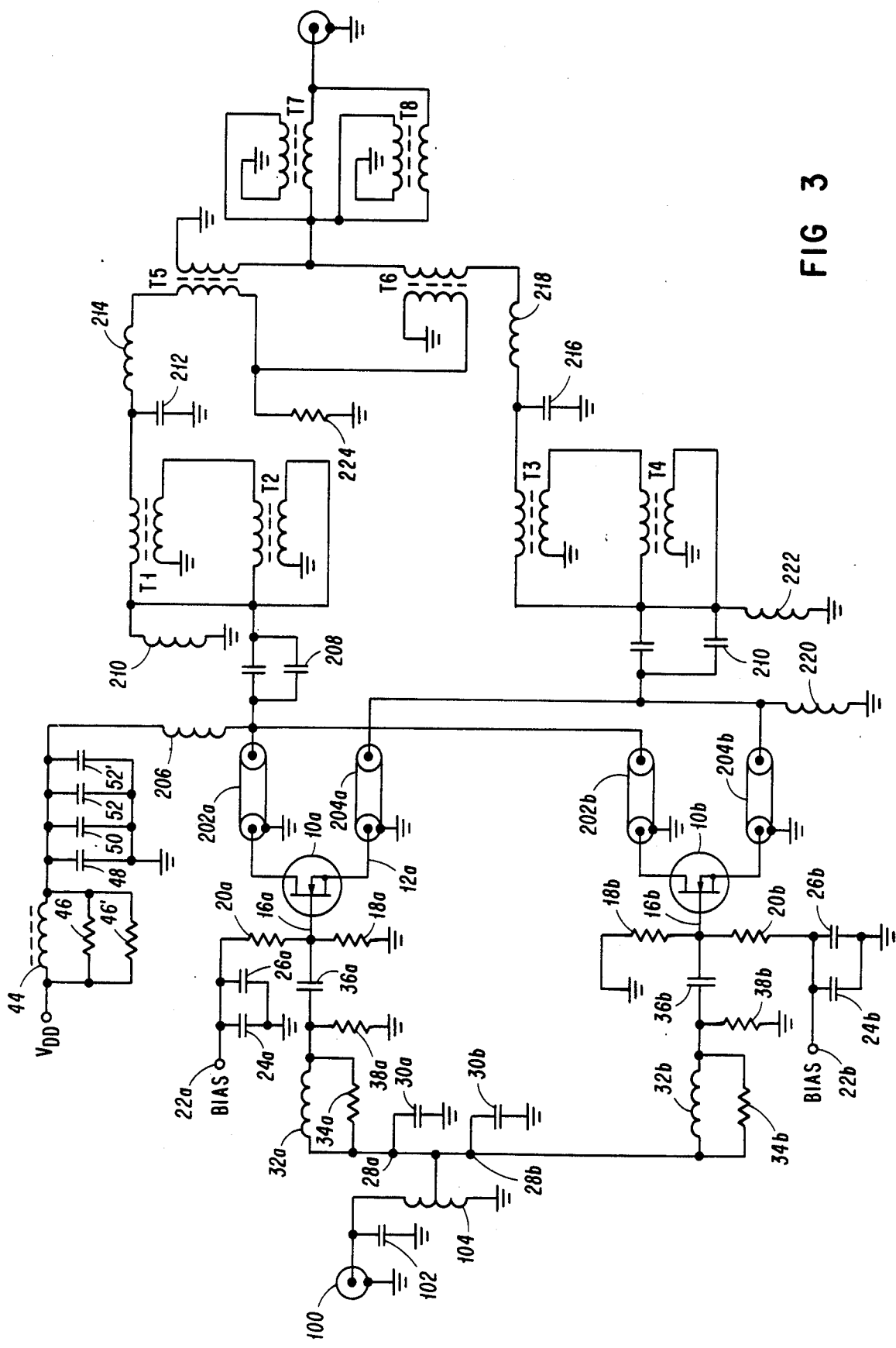
FIG. 3 is a circuit diagram of an alternative embodiment of the compound power amplifier of FIG. 2.

In the operation of the circuit of FIG. 1, gate 16 of FET 10 is biased to the desired level by the division of voltage provided by bias supply 22 by resistors 18 and 20 of properly chosen values. In the preferred embodiment the bias is chosen for class AB operation, and a signal to be amplified is provided at input 28 to load resistor 38. The impedance of the signal source and that of the amplifier stage shown in FIG. 3 are matched across a broad range of frequencies by the matching network comprised of capacitor 30, inductor 32, and resistor 34. The RF voltage developed across resistor 38 at node 31 is coupled to gate 16 of FET 10 through coupling capacitor 36. RF signals are decoupled from bias supply 22 by capacitors 24 and 26.

The amplified signal flowing in the source 12 and drain 14 are coupled to the secondary windings 57 and 43, respectively. The portion of the signal in secondary winding 43 of transformer 42 is passed to the primary windings 72 and 78 of transformers 74 and 80, respectively, where it is added to the portion of the signal in secondary winding 57 of transformer 56, which is passed to the secondary windings 76 and 82 of transformers 74 and 80, respectively. The signal coupled through transformer 42 from the circuit of drain 14 is 180 degrees out of phase from that coupled through transformer 56 in the circuit of source 12. These signals are brought into phase and thus added by the interconnection of transformers 74 and 80, and the combined signal is provided to RF output connector 98 where it may be coupled directly to an antenna or combined with the outputs of other similar amplifiers for higher power outputs. Any imbalance in power passing into transformers 74 and 80 by means of the two paths previously described is dissipated in resistor 84.

The amplifier circuit of FIG. 1 provides excellent intermodulation distortion reduction. While a class AB amplifier using a common source (or emitter in the case of a bipolar transistor) circuit exhibits IMD products approximately 30 db below either tone of a two-tone test signal, the circuit of the present invention exhibits IMD levels of 45 db or more below the test signal tones. The distortion is reduced by the 10% negative voltage feedback in the circuit of source 12. The voltage at the source is approximately 0.9 of the voltage at the gate 16, and the gain at source 12 is due only to the difference in the impedance between gate 16 and source 12. Gain of approximately 10 db is possible in the circuit due to the presence of transformer 42 in the circuit of drain 14 and to the impedance difference of the source. Both the gain and device dissipation are improved by the two transformer techniques. Two separate transformers are used to prevent coupling between the source 12 and drain 14. The series capacitors 60, 62 and 64, and shunt inductor 68 in the drain circuit, and the series capacitors 86, 88 and 90 and shunt inductor 92 improve the low frequency response of transformers 42 and 56, respectively.

Figure 2:
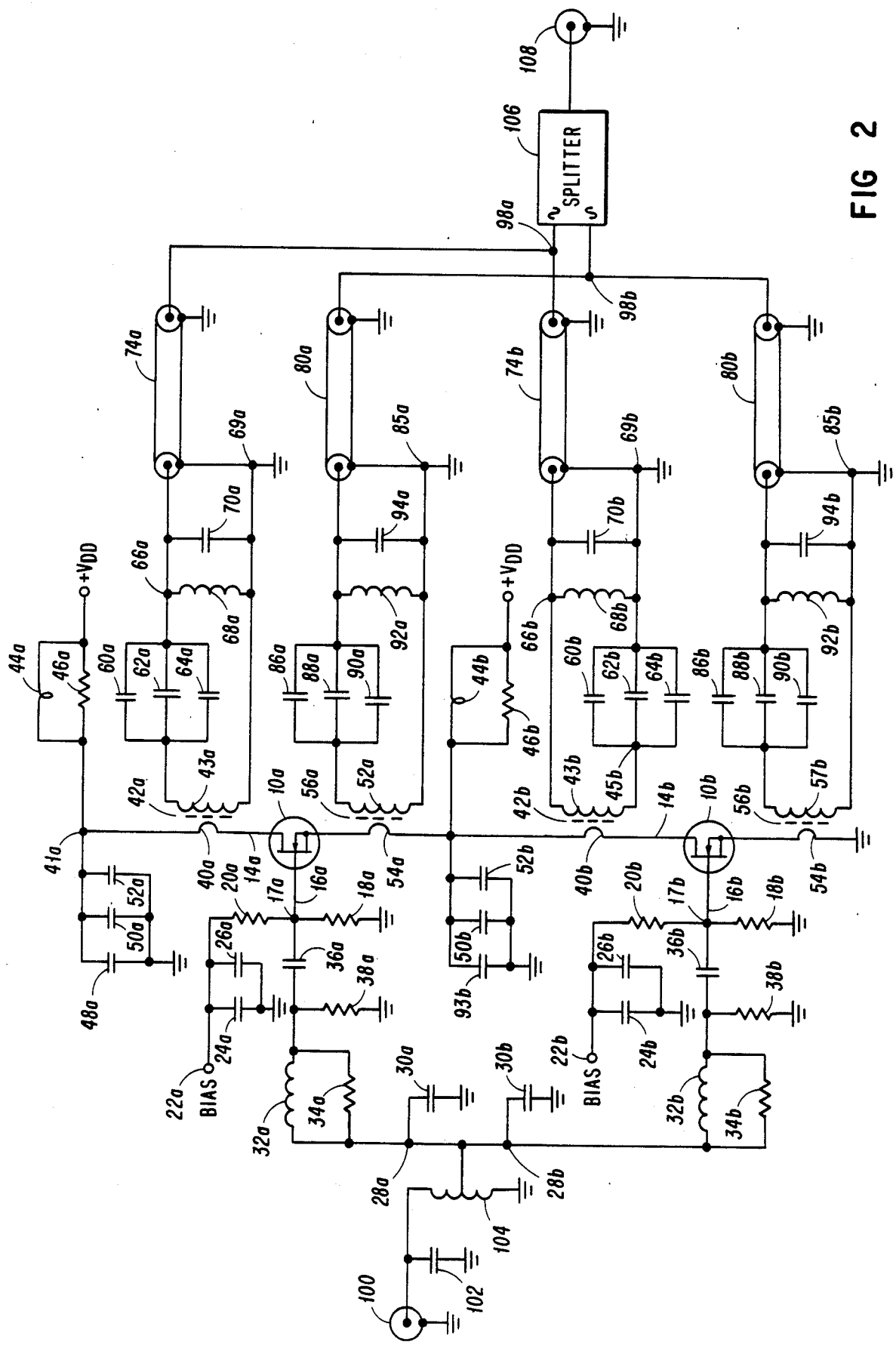
FIG. 2 is a circuit diagram of a compound power amplifier employing a paralleled pair of FET amplifiers as illustrated in FIG. 1.

Two or more amplifier circuits of the type shown in FIG. 1 can be combined as shown in FIG. 2. Components corresponding to components shown in FIG. 1 are designated with an "a" suffix for the first amplifier and a "b" suffix for the second amplifier. Input is provided at connector 100 across capacitor 102, and the signal is lowered in impendance by auto transformer 104. Half of the signal is directed to the first amplifier shown in the upper portion of the drawing at 28a, and half is directed to the second amplifier shown in the lower portion at 28b. After the signals are amplified in circuits "a" and "b" as described in accordance with FIG. 1, the amplified signals at points 98a and 98b are combined by a 180° splitter 106 and provided to an output connector 108 for transmission to an antenna or other load.

In FIG. 3, an alternative circuit to that shown in FIG. 2 is shown. Again, components corresponding to components shown in FIG. 1 are designated by an "a", "b", or a prime character suffix. The differences in the circuit of FIG. 3 as compared to FIG. 2 appear in the portion of the circuit to the right of FETs 10a and 10b. Basically in FIGS. 1 and 2 the transistors are paralleled after (in terms of signal flow) output transformers 42a, 42b, 56a, and 56b, whereas in FIG. 3 they are paralleled before transformers T1/T2 and T3/T4, which provides a saving in component count. Since FETs 10a and 10b need to be separated from each other and from transformers T1/T2 and T3/T4 for cooling reasons, transmission lines 202a and 202b are used in the drain circuits of FETs 10a and 10b, respectively, and transmission lines 204a and 204b are used in the respective source circuits to communicate signals to the rest of the circuit.

The sources of FETs 10a and 10b are raised above reference potential by the impedance of transformers T3/T4, which provides the requisite feedback to the gate circuit as previously discussed. In contrast to the circuit of FIG. 2, $V_{DD}$ is shunt fet to FETs 10a and 10b through RF feed choke 206 rather than through output transformers to prevent transformer saturation. RF coupling capacitors 208 and 210 (two each) prevent entry of the DC circuit into transformers T1/T2 and T3/T4. The combination of choke 206, choke 210, and capacitors 208 form a PI network which improves the linearity of the amplifier by providing a lower impedance at audio frequencies. Inductors 220 and 222, and capacitors 210 provide a similar function.

The combination of capacitor 212 and inductor 214 provide frequency compensation. A similar function is provided by capacitor 216 and inductor 218. Transformer T5 and T6 provide a combiner function and, resistor 224 acts as dump resistor. Transformers T7 and T8 provide impedance transformation for matching to subsequent circuitry.

While particular embodiments of the invention have been shown and described, it is obvious that minor changes and modifications may be made therein without departing from the true scope and spirit of the invention. It is the intention of the appended claims to cover all such changes and modifications.

We claim:

1. A power amplifier exhibiting low intermodulation distortion and wideband performance, comprising:
    input circuit means for receiving an RF signal to be amplified;
    a field-effect-transistor having a gate terminal, a source terminal, and a drain terminal, said gate terminal being coupled to the input circuit means for receipt of the signal to be amplified, said transistor further being biased for class AB amplification of said signal;
    a first transformer the primary winding of which is coupled to the drain terminal of said transistor to receive said amplified signal;
    a second transformer the primary winding of which is coupled to the source terminal of said transistor to receive said amplified signal; and
    circuit means for combining the amplified signal passing through the first and second transformers.

2. A power amplifier exhibiting low intermodulation distortion and wideband performance comprising:

means for receiving an RF signal;

means for dividing the RF signal into two components;

first input circuit means for receiving a first component of said RF signal;

a first field-effect-transistor having source, drain, and gate terminals, said gate terminal coupled to the first input circuit means;

a second input circuit means for receiving a second component of said RF signal;

a second field-effect-transistor having source, drain, and gate terminals, said gate terminal coupled to the second input circuit means;

first output circuit means coupled to the drain terminals of both the first and second field-effect-transistors for receiving a first portion of the amplified signal;

second output circuit means coupled to the source terminals of both the first and second field-effect-transistors for receiving a second portion of the amplified signal; and means coupled to the first and second output circuit means for combining said first and second portions of said amplified signal.

3. A power amplifier circuit as described in claim 2 wherein said first output circuit means includes a transformer.

4. A power amplifier circuit as described in claim 3 wherein said second output circuit means includes a transformer.

5. A power amplifier circuit as described in claim 4 wherein said first and second field-effect-transistors are biased for Class AB operation.

6. An RF amplifier comprising:

an input circuit for receiving an RF signal to be amplified;

a FET having a source, a drain, and a gate, the gate and source of which form a portion of the input circuit; and an output circuit for receiving said signal from the FET, said output circuit incorporating the source and drain of said FET therein, said output circuit including a first transformer in series with said drain of said FET and a second transformer in series with said source of FET, to provide RF feedback to said input circuit.

7. An RF amplifier as described in claim 6 further including a signal combiner coupled to said first and second transformers.

8. An RF amplifier as described in claim 7 wherein said FET is biased for Class AB operation.

* * * * *